United States Patent [19]
Akiba et al.

[11] Patent Number: 4,653,058
[45] Date of Patent: Mar. 24, 1987

[54] DISTRIBUTED FEEDBACK SEMICONDUCTOR LASER WITH MONITOR

[75] Inventors: Shigeyuki Akiba, Tokyo; Katsuyuki Utaka, Musashino; Kazuo Sakai, Tokyo; Yuichi Matsushima, Tokorozawa, all of Japan

[73] Assignee: 501 Kokusai Denshin Denwa Kabushiki Kaisha, Tokyo, Japan

[21] Appl. No.: 487,124

[22] Filed: Apr. 21, 1983

[30] Foreign Application Priority Data

Apr. 27, 1982 [JP] Japan .................................. 57-69508

[51] Int. Cl.$^4$ ............................................. H01S 3/19
[52] U.S. Cl. ........................................ 372/50; 357/19; 372/29; 372/96
[58] Field of Search ...................... 372/50, 96, 29, 32; 357/17, 19

[56] References Cited

U.S. PATENT DOCUMENTS

3,999,146 12/1976 Lang et al. ............................ 372/50

FOREIGN PATENT DOCUMENTS

0137686 12/1978 Japan .................................... 372/50

*Primary Examiner*—James W. Davie
*Attorney, Agent, or Firm*—Robert E. Burns; Emmanuel J. Lobato; Bruce L. Adams

[57] ABSTRACT

A distributed feedback semiconductor laser with a monitor, which has periodic corrugations on a light emitting layer or an adjoining layer in the direction of travel of light and performs laser oscillation by the injection of a current into said light emitting layer. In accordance with the present invention, a laser region forming said distributed feedback semiconductor laser and a monitor region for detecting the output of said laser region are disposed on the same substrate. A gap between said monitor region and said laser region is filled with a semiconductor of an energy bandgap larger than that of the light emitting layer of said laser region.

10 Claims, 6 Drawing Figures

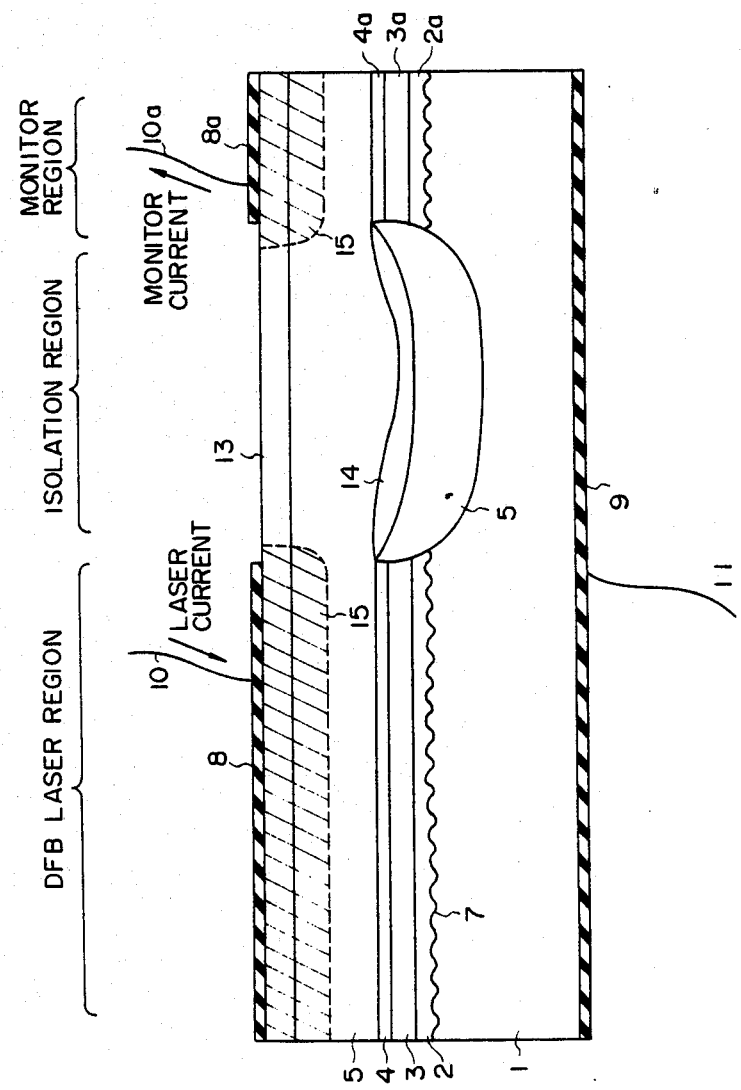

DISTRIBUTED FEEDBACK SEMICONDUCTOR LASER WITH MONITOR

BACKGROUND OF THE INVENTION

The present invention relates to integration of a semiconductor laser and a photo-detector for monitoring the output light thereof.

A distributed feedback laser (hereinafter referred to as a DFB laser) is an excellent laser which performs single longitudinal mode oscillation, and it is usable as a light source for high quality optical fiber communications. In case of monitoring the output light of the conventional semiconductor laser, a monitor is provided at the outside or in combination with the distributed feedback laser. However, it is very difficult to associate a monitor with a distributed feedback laser so as to effectively and stably detect the output light of the distributed feedback laser.

SUMMARY OF THE INVENTION

In view of such defects of the prior art, an object of the present invention is to provide a distributed feedback semiconductor laser with a monitor in which the DFB laser and an output light monitoring photo-detector are disposed on the same substrate so as to make the most of the features of the DFB laser and to obviate the inconveniences arising from separate assembling of the laser and the photo-detector.

In accordance with the present invention, there is provided a distributed feedback semiconductor laser with a monitor, which has periodic corrugations on a light emitting layer or an adjoining layer in the direction of travel of light and performs laser oscillation by the injection of current into said light emitting layer, characterized in that a laser region forming said distributed feedback semiconductor laser and a monitor region for detecting the output of said laser region are disposed on the same substrate, and in that a gap between said monitor region and said laser region is filled with a semiconductor of an energy bandgap larger than that of the light emitting layer of said laser region.

BRIEF DESCRIPTION OF THE ACCOMPANYING DRAWINGS

The present invention will be described in detail below in comparison with conventional arts with reference to the accompanying drawings, in which.

DETAILED DESCRIPTION

For ready understanding the features and merits of the present invention, prior arts will first be described.

Figure 1:
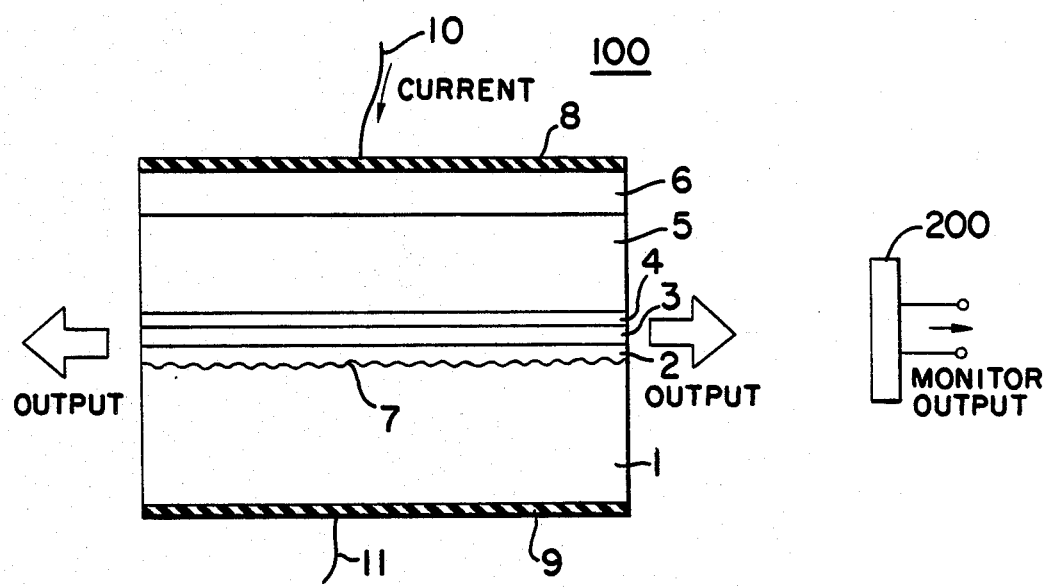
FIG. 1 is a sectional view showing a prior art example of the arrangement of a DFB laser and a photo-detector for monitoring it.

FIG. 1 illustrates an example of the DFB laser formed of a semiconductor of InGaAsP/InP alloys. In FIG. 1, reference numeral 1 indicates an n-type InP substrate; 2 designates an n-type InGaAsP waveguide layer; 3 identifies an InGaAsP light emitting layer; 4 denotes an InGaAsP buffer layer for preventing a meltback of the light emitting layer 3; 5 represents a p-type InP layer; 6 shows a p-type InGaAsP cap layer; 8 and 9 refer to electrodes; and 10 and 11 signify leads. Periodic corrugations 7 are characteristic of the DFB laser, and its oscillation frequency is determined directly by the period of the corrugations. With the DFB laser, since the periodic structure itself serves as a resonator, there is no need for a cleavage plane for forming a Fabry-Perot resonator necessary for a conventional semiconductor laer, and it is rather preferable that light be not reflected at the output end.

On the other hand, in case of monitoring the output light of the conventional semiconductor laser, it is general practice in the prior art to employ such an arrangement as shown in FIG. 1 in which, for example, a germanium photodiode or the like is disposed as a photodetector 200 on an extension of the one output end for monitoring the output current. With such a monitoring system, it is necessary to separately fabricate a laser 100 and the photo-detector 200 from each other and to stabilize their relative positions. Furthermore, in case of arranging a plurality of lasers, the overall apparatus becomes bulky and the assembling is also difficult.

Figure 2:
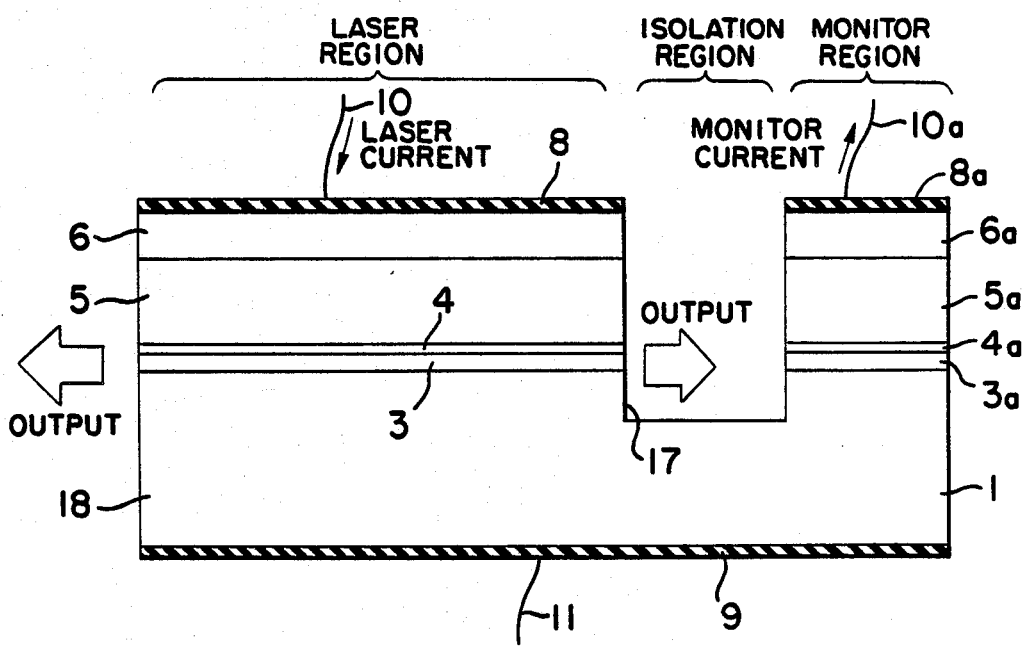
FIG. 2 is a sectional view showing a prior art example in which a Fabry-Perot type laser and a monitor are disposed on the same substrate.

A solution to the abovesaid problem is such a prior art example as shown in FIG. 2 in which a Fabry-Perot type laser and an output light monitor are integrated together. An end face 18 is formed by ordinary cleavage and the other end face 17 is formed by chemical etching or the like, but it is difficult to form the end face 17 in parallel to the end face 18. Moreover, when the end face 17 is also formed by cleavage, a special layer structure must be employed.

Figure 3:
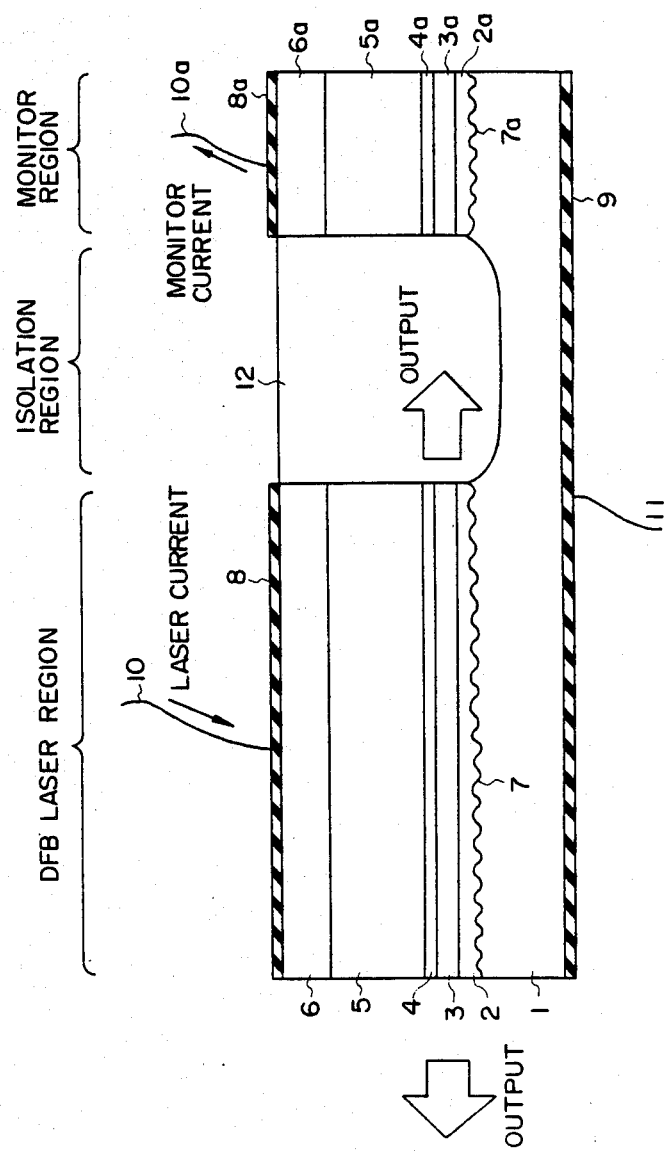
FIG. 3 is a sectional view illustrating an embodiment of the present invention.

The present invention will hereinafter be described in detail below. FIG. 3 illustrates an embodiment of the present invention. After forming a wafer of the same layer structure as the DFB laser of FIG. 1, an isolation region defined between the laser region and the monitor region, for isolating them, is homogeneously filled with a semiconductor 12 of a larger energy bandgap than that of the light emitting layer 3, for example, of high resistance InP, and electrodes 8 and 8a and leads 10 and 10a are provided for the laser and the monitor region independently of each other, forming the DFB laser region and the monitor region on the same substrate 1. With such a structure, the buried portion of the semiconductor 12 has a larger energy bandgap than does the light emitting region 3, and hence does not absorb the output light from the laser region and is a transparent window; this permits the output light to readily reach the monitor region and appreciably reduces reflection at the boundary between the light emitting layer 3 and the buried portion 12, ensuring to provide stabilized laser oscillation. On the other hand, in this embodiment, a light detecting portion 3a of the monitor region is identical in layer structure with the light emitting layer 3 of the DFB laser region but able to sufficiently detect light since the photo energy of the output light is usually slightly larger than the energy bandgap of the light emitting layer 3 of the DFB laser region. Of course, the layer structure of the monitor region need not always be the same as the layer structure of the DFB laser region but the light detection is possible if the energy gap of the light detecting layer is equal to or smaller than the energy bandgap of the light emitting layer. However, it is evidently advantageous, in terms of easiness in manufacture, to employ the same layer structure of the DFB laser region and the monitor region.

Figure 4A:
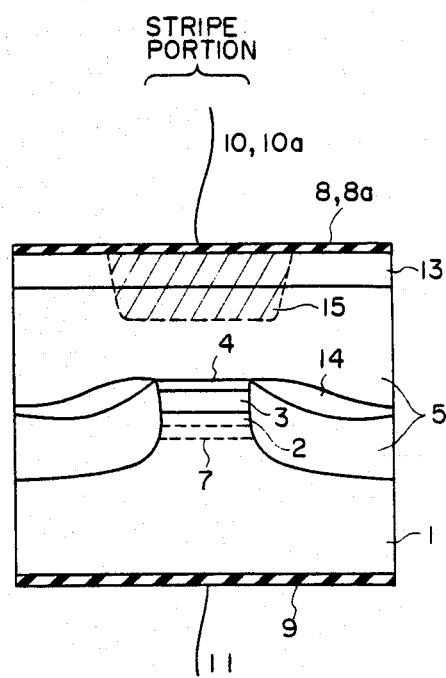
FIGS. 4 and 5 are sectional views illustrating other embodiments of the present invention as being applied to a buried stripe structure.
Figure 5:
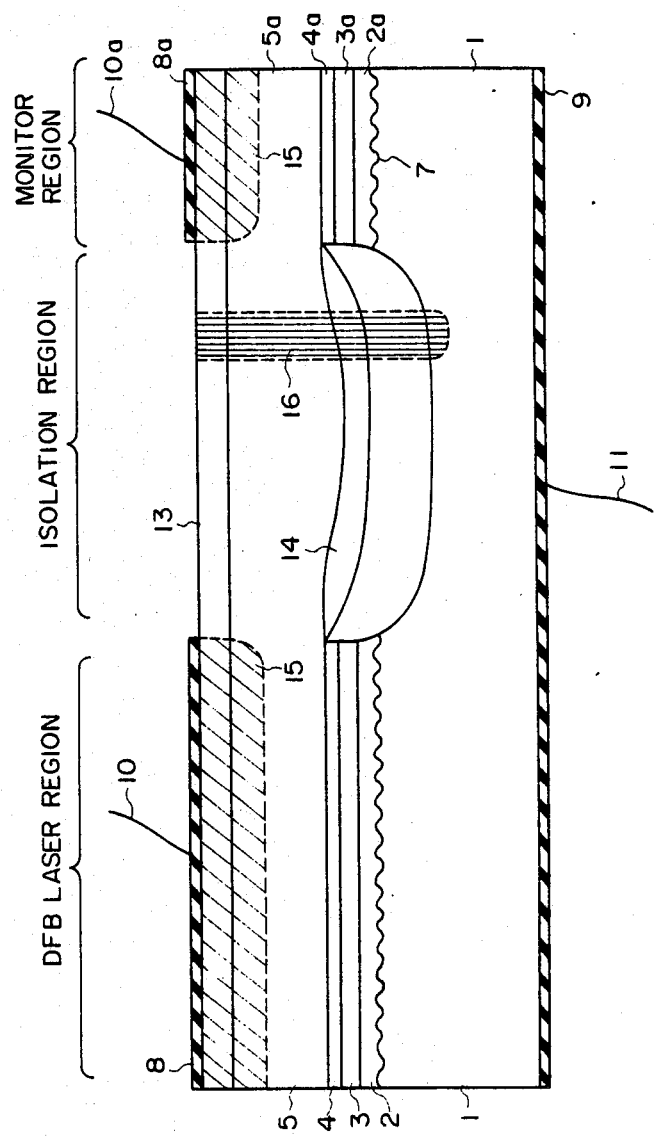

While in the foregoing no mention has been made of a buried stripe structure for stabilizing the lateral mode of the laser, there is shown in FIG. 4 an embodiment of the DFB laser which employs the buried stripe structure for lateral mode stabilization. FIG. 4(A) shows the layer structure as viewed from the plane from which light is emitted, and FIG. 4(B) the layer structure as viewed from the lateral direction. The p-type InP layer 5 and an n-type InP layer 14 are buried in the portion outside the isolation region and the stripe portion, by which a window effect for the output light of the lateral mode stabilized DFB laser and a current blocking function are provided in combination. A cap layer 13 is an n-type InGaAsP layer in this case, and a Zn-diffused region 15 (indicated by hatching) is formed only in a current path portion. On the other hand, from the viewpoint of electrical isolation of the DFB laser region and the monitor region, the p-type InP layer 5 is formed to extend into both of them in the structure of FIG. 4, so that they are not completely isolated. Consequently, a portion of a voltage applied to the DFB laser region leaks out into the monitor region, resulting in a monitor current becoming a superimposition of a current generated by light detection on the leakage current. This evil can be removed by additionally providing an external circuit for eliminating the leakage current in advance, but the leakage current can be blocked by providing an electrical isolation region 16 (indicated by vertical lines) in the isolation region in the vicinity of the monitor region as shown in FIG. 5. This can be achieved, for instance, by introducing an impurity into the region 16 by diffusion or ion implantation to form an n-type InP region, by applying protons or the like to the region 16 to form a high resistance region, or by removing the region 16 through etching from the device.

As has been described in the foregoing, according to the present invention, the laser and the monitor are integrated on the same substrate and, by employing the same layer structure for the laser and the monitor portion, the DFB laser with a monitor can easily be manufactured without increasing the number of steps involved in its manufacture. Moreover, since reflection at one end face of the DFB laser is small, the characteristics of the DFB laser itself is improved, fully exhibiting the features of the single longitudinal mode laser.

Furthermore, although the foregoing description has been given of the case using semiconductors of InGaAsP alloys, the present invention can also easily be applied to other materials of AlGaAs alloys and so on. The present invention is also applicable not only to the buried stripe structure but also to other stripe structures.

Such a DFB laser with a monitor is very promising as a light source for high performance optical fiber communications, and hence is of great utility.

What we claim is:

1. In a distributed feedback semiconductor having a laser region and a monitor region integral therewith as a unitary structure, a common substrate mounting said laser region and said monitor region, the laser region having a light emitting layer and an adjoining layer defining therebetween corrugations causing refractive index variations in the travelling direction of light and which performs laser oscillation by the injection of a current into the light emitting layer, an electrode for injection of said current into the light emitting layer, the monitor region having a light detecting layer, a semiconductor of high resistance defining an isolation region between the laser region and the monitor region integral therewith on said common substrate and defining a transparent window to output light of the laser region, the isolation region semiconductor having an energy bandgap larger than that of the light-emitting layer of the laser region and effective to appreciably reduce reflection at a boundary between the light emitting layer and said semiconductor to thereby ensure stabilized laser oscillation of the laser region, and an electrode to take out a monitor current output from said monitor region.

2. In a distributed feedback semiconductor laser having a laser region and a monitor region according to claim 1 in which the layers of the laser region and layers of the monitor region are of different structure, and the energy gap of the light detecting layer is equal to or smaller than the energy bandgap of the light-emitting layer.

3. In a distributed feedback semiconductor laser having a laser region and a monitor region according to claim 1 in which the semiconductor of the isolation region is of InP of high resistance.

4. In a distributed feedback semiconductor laser having a laser region a monitor region according to claim 3 in which the layers of the laser region and layers of the monitor region are of the same structure.

5. In a distributed feedback semiconductor laser having a laser region and a monitor region according to claim 1, in which an electrical isolation region is provided at a part of said isolation region to electrically isolate between said laser region and said monitor region.

6. In a distributed feedback semiconductor laser having a laser region and a monitor region according to claim 5, in which said electrical isolation region is formed by a second semiconductor region having an impurity different in conductivity type from the first-mentioned semiconductor.

7. In a distributed feedback semiconductor laser having a laser region and a monitor region according to claim 5, in which said electrical isolation region is formed by applying protons to a part of the first-mentioned semiconductor so as to form a high resistance region.

8. In a distributed feedback semiconductor laser having a laser region and a monitor region according to claim 5, in which said electrical isolation region is formed by removing the same through etching from said isolation region so as to provide an air gap.

9. In a distributed feedback semiconductor laser having a laser region and a monitor region according to claim 5 or 6, in which a part of the semiconductor of the gap region is InP of n-type.

10. In a distributed feedback semiconductor laser having a laser region and a monitor region according to claim 5 or 7, in which a part of the semiconductor of the gap region is InP of high resistance.

* * * * *